United States Patent
Hu

(10) Patent No.: US 11,839,087 B2
(45) Date of Patent: Dec. 5, 2023

(54) FERROELECTRIC MEMORY DEVICES WITH REDUCED EDGE DEFECTS AND METHODS FOR FORMING THE SAME

(71) Applicant: WUXI SMART MEMORIES TECHNOLOGIES CO., LTD., Wuxi (CN)

(72) Inventor: Yushi Hu, McLean, VA (US)

(73) Assignee: WUXI PETABYTE TECHNOLOGIES CO., LTD., Wuxi (CN)

( * ) Notice: Subject to any disclaimer, the term of this patent is extended or adjusted under 35 U.S.C. 154(b) by 64 days.

(21) Appl. No.: 16/578,075

(22) Filed: Sep. 20, 2019

(65) Prior Publication Data
US 2021/0091096 A1    Mar. 25, 2021

(51) Int. Cl.
*H10B 53/00*    (2023.01)
*G11C 11/22*    (2006.01)

(52) U.S. Cl.
CPC ............ *H10B 53/00* (2023.02); *G11C 11/221* (2013.01)

(58) Field of Classification Search
CPC ............ G11C 11/221; G11C 27/11502; H01L 27/11502; H01L 27/11507; H01L 24/11502; H01L 29/516; H10B 53/00; H10B 53/30
See application file for complete search history.

(56) References Cited

U.S. PATENT DOCUMENTS

| | | | | |
|---|---|---|---|---|
| 5,481,490 A | * | 1/1996 | Watanabe | H01L 27/11502 257/E21.009 |
| 6,165,802 A | | 12/2000 | Cuchiaro et al. | |
| 2002/0038402 A1 | * | 3/2002 | Kanaya | H01L 21/76801 257/E21.664 |
| 2002/0196653 A1 | * | 12/2002 | Kim | H01L 27/11502 365/100 |
| 2004/0135183 A1 | * | 7/2004 | Matsuura | H10B 53/30 257/295 |
| 2006/0118841 A1 | * | 6/2006 | Eliason | H10B 53/00 257/295 |
| 2007/0052065 A1 | * | 3/2007 | Kanaya | H01L 28/55 257/532 |
| 2008/0111172 A1 | * | 5/2008 | Wang | H01L 28/56 257/295 |

(Continued)

FOREIGN PATENT DOCUMENTS

| CN | 1841746 A | 10/2006 |
|---|---|---|
| CN | 1881591 A | 10/2006 |
| CN | 101416275 A | 4/2009 |

OTHER PUBLICATIONS

International Search Report and Written Opinion issued in corresponding International Application No. PCT/CN2020/077928, dated Jun. 28, 2020, 9 pages.

*Primary Examiner* — Samuel A Gebremariam
*Assistant Examiner* — Jonas T Beardsley
(74) *Attorney, Agent, or Firm* — Bayes PLLC

(57) ABSTRACT

Embodiments of ferroelectric memory devices and methods for forming the ferroelectric memory devices are disclosed. In an example, a ferroelectric memory cell includes a first electrode, a second electrode, and a ferroelectric layer disposed between the first electrode and the second electrode. An edge region exposed by the first electrode and the second electrode is covered by at least one of a healing layer or a block layer.

12 Claims, 10 Drawing Sheets

(56) References Cited

U.S. PATENT DOCUMENTS

2015/0072441 A1* 3/2015 Sun .................. H01L 27/11507
  438/3
2015/0221657 A1* 8/2015 Sashida .................. H10B 53/30
  257/532

* cited by examiner

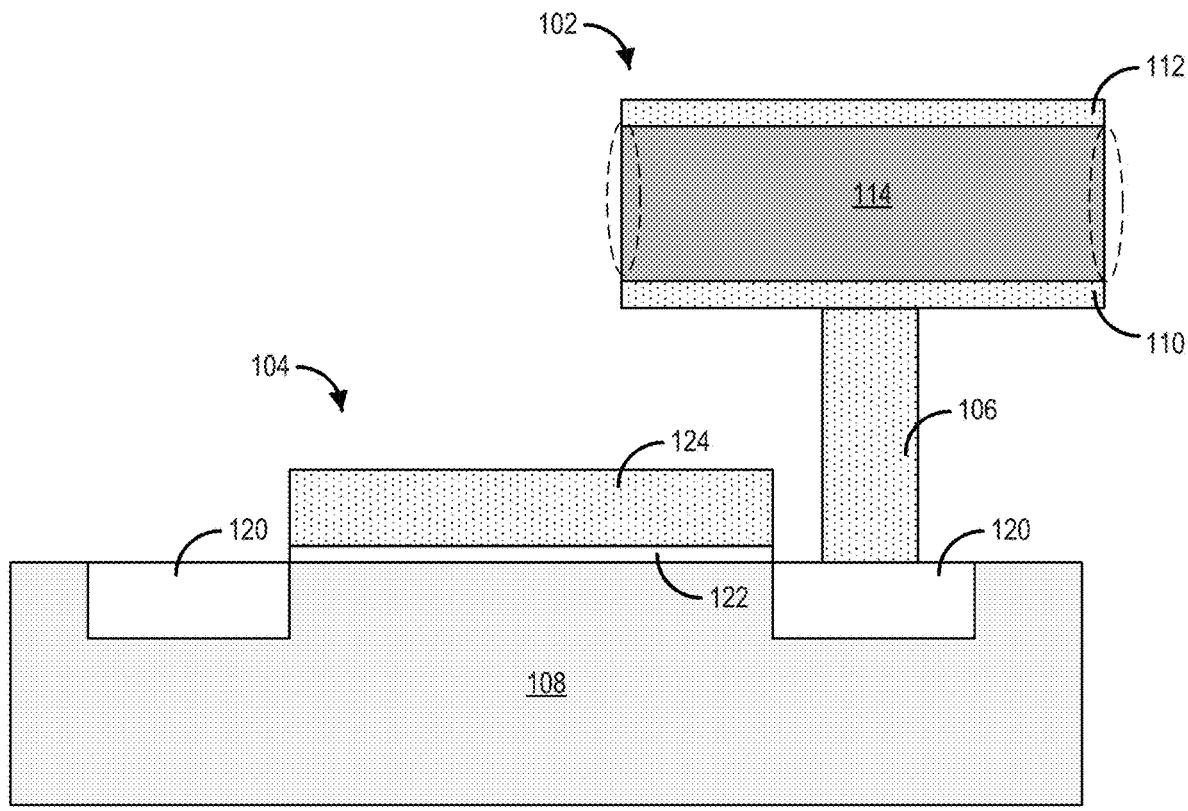
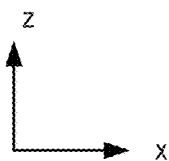
FIG. 1

102

102

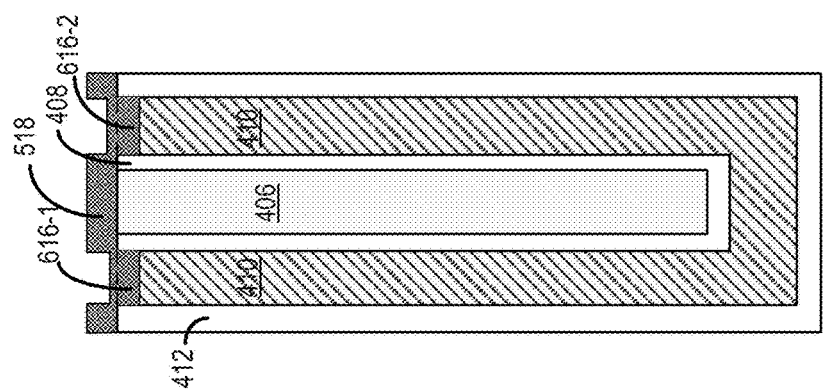

FERROELECTRIC MEMORY DEVICES WITH REDUCED EDGE DEFECTS AND METHODS FOR FORMING THE SAME

BACKGROUND

Embodiments of the present disclosure relate to ferroelectric memory devices and fabrication methods thereof.

Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

BRIEF SUMMARY

Embodiments of ferroelectric memory devices and fabrication methods thereof are disclosed herein.

In one example, a ferroelectric memory cell includes a first electrode, a second electrode, and a ferroelectric layer disposed between the first electrode and the second electrode. An edge region exposed by the first electrode and the second electrode may be covered by at least one of a healing layer or a block layer.

In some embodiments, the healing layer includes at least one of HfOx, ZrOx, AlOx, HfZrOx, HfSiOx, or TiAlOx, and has a thickness of about 5 Å to about 500 Å. In some embodiments, the block layer includes at least one of silicon nitride, silicon oxynitride, or aluminum oxide, and has a thickness of about 15 Å to about 500 Å.

In some embodiments, the healing layer covers the edge region and the block layer covers the healing layer.

In some embodiments, the healing layer is doped with at least one of Hf, Zr, Ti, Al, Si, V, O, H, Nb, Ta, Y, gadolinium (Gd), or La.

In some embodiments, the edge region includes an edge doped portion covered by the at least one of a healing layer or a block layer.

In some embodiments, the edge doped portion includes at least one of hafnium (Hf), zirconium (Zr), titanium (Ti), aluminum (Al), silicon (Si), hydrogen (H), oxygen (O), vanadium (V), niobium (Nb), tantalum (Ta), yttrium (Y), or lanthanum (La), and extends along a concentration gradient from the exposed surface of the ferroelectric layer into a depth in the ferroelectric layer, the depth being in a range of about 5 Å to about 10 nm.

In some embodiments, the edge region of the ferroelectric layer further includes a recessed portion covered by the healing layer, the healing layer covered by the block layer.

In some embodiments, the first electrode and the second electrode each includes at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbide (WCNx), ruthenium (Ru), or ruthenium oxide (RuOx). In some embodiments, the ferroelectric layer includes at least one of aluminum (Al), hafnium (Hf), zirconium (Zr), oxygen (O), or titanium (Ti).

In some embodiments, the ferroelectric layer is doped with at least one of Hf, Zr, Ti, Al, silicon (Si), hydrogen (H), O, vanadium (V), niobium (Nb), tantalum (Ta), yttrium (Y), or lanthanum (La).

In another example, a ferroelectric memory cell includes a first electrode, a second electrode, and a ferroelectric layer disposed between the first electrode and the second electrode. The ferroelectric layer may include an edge region exposed by the first electrode and the second electrode. The edge region may include a recessed portion that is covered by at least one of a healing layer or a block layer.

In some embodiments, the healing layer includes at least one of HfOx, ZrOx, AlOx, HfZrOx, HfSiOx, or TiAlOx, and has a thickness of about 5 Å to about 500 Å. In some embodiments, the block layer includes at least one of silicon nitride, silicon oxynitride, or aluminum oxide, and has a thickness of about 15 Å to about 500 Å.

In some embodiments, the healing layer covers the edge region and the block layer covers the healing layer.

In some embodiments, the healing layer is doped with at least one of Hf, Zr, Ti, Al, Si, V, O, H, Nb, Ta, Y, gadolinium (Gd), or La.

In some embodiments, the first electrode and the second electrode each includes at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbide (WCNx), ruthenium (Ru), or ruthenium oxide (RuOx). In some embodiments, the ferroelectric layer includes at least one of aluminum (Al), hafnium (Hf), zirconium (Zr), oxygen (O), or titanium (Ti), and is doped with at least one of Hf, Zr, Ti, Al, silicon (Si), hydrogen (H), O, vanadium (V), niobium (Nb), tantalum (Ta), yttrium (Y), or lanthanum (La).

In a further example, a method for forming a ferroelectric memory cell includes forming a first electrode, forming a ferroelectric layer in contact with the first electrode, and forming a second electrode in contact with the ferroelectric layer. The method may also include forming at least one of a healing layer or a block layer over an edge region of the ferroelectric layer exposed by the first electrode and the second electrode.

In some embodiments, forming the healing layer includes performing at least one of a chemical vapor deposition (CVD), an atomic layered deposition (ALD), a sol-gel process, a metal-organic chemical vapor deposition (MOCVD), or a chemical solution deposition (CSD) to form at least one of HfOx, ZrOx, AlOx, HfZrOx, HfSiOx, or TiAlOx over the edge region. In some embodiments, forming the block layer includes performing at least one of a CVD, an ALD, a pulsed laser deposition (PLD), a sol-gel process, or a CSD to form at least one of silicon nitride, silicon oxynitride, or aluminum oxide over the healing layer.

In some embodiments, the method further includes performing an in-situ doping process, an ion implantation process, a thermal diffusion process, or a plasma doping process to dope a plurality of dopants into the healing layer.

In some embodiments, the method further includes forming an edge doped portion in and exposed by the edge region.

In some embodiments, forming the edge doped portion includes performing at least one of a CVD, an ALD, or a plasma doping on edge region to form a plurality of monolayers of dopant-rich material extending from the surface of the ferroelectric layer into the ferroelectric layer.

In some embodiments, the method further includes performing at least one of a thermal diffusion process or a thermal annealing process on the plurality of monolayers of dopant-rich material.

In some embodiments, the method further includes forming a recessed portion in and exposed by the edge region. The recessed portion may be in contact with the at least one of a healing layer or a block layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1 illustrates a cross-section of an exemplary ferroelectric memory cell with reduced edge defects, according to some embodiments of the present disclosure.

FIGS. 5A-5E and 6 each illustrates a cross-section of an exemplary ferroelectric capacitor with reduced edge defects in a three-dimensional (3D) ferroelectric memory cell, according to some embodiments of the present disclosure.

Figure 2A:
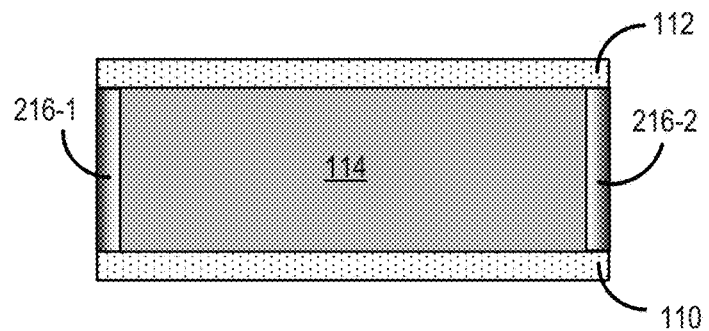
FIGS. 2A-2E and 3 each illustrates a cross-section of an exemplary ferroelectric capacitor with reduced edge defects in a two-dimensional (2D) ferroelectric memory cell, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) memory device" refers to a semiconductor device with vertically oriented strings of memory cell transistors (referred to herein as "memory strings") on a laterally-oriented substrate so that the memory strings extend in the vertical direction with respect to the substrate. As used herein, the term "vertical/vertically" means nominally perpendicular to the lateral surface of a substrate.

One limitation of existing ferroelectric memory device fabrication is process-related damages caused by the various fabrication operations involved in the formation of the ferroelectric memory device. For example, an isolation process often includes operations such as etching and ion implantation process to form regions and/structures that isolate a ferroelectric memory cell from neighboring structures/devices. These operations can cause damages, e.g., crystalline defects, to the edges of the ferroelectric layer in the ferroelectric memory cell. In another example, contaminations, e.g., chemical contamination caused by wet etching process and plasma contamination caused by dry etching process, resulted from the various operations for forming ferroelectric memory, can alter the physical and/or electrical properties of the ferroelectric layer in these defective areas, resulting in edge effects. Also, after the formation of the memory cell, edges of the memory cell are susceptible to contaminant diffusion caused by moisture, hydrogen, oxygen, metallic dopants, etc., causing degradation of the material property of edges. The performance of the ferroelectric memory cell can be impaired, e.g., to have higher leakage current and/or reduced capacitance.

Various embodiments in accordance with the present disclosure provide a ferroelectric memory device with reduced edge defects. A number of approaches are taken to reduce the edge defects in a ferroelectric layer of the ferroelectric memory device. In some embodiments, a doped portion is formed in the defective edge region of the ferroelectric layer to repair the crystalline structure of the ferroelectric layer. In some embodiments, a healing layer, doped or undoped, is formed to passivate the defective edge region by forming bonding with the dangling bonds on the surface of the defective edge region. In some embodiments, a block layer is formed to prevent contaminants from the ferroelectric layer. In some embodiments, the defective edge region is removed and passivated with the healing layer. In some embodiments, other methods such as thermal annealing and/or thermal diffusion are used to further reduce the edge defects. In some embodiments, two or more methods, e.g., methods described above, are combined to further reduce the edge defects of the ferroelectric memory device. These methods and structures can be applied to both 2D ferroelectric memory cells and 3D ferroelectric memory cells. With reduced edge defects, the performance of the ferroelectric memory devices can be improved.

FIG. 1 illustrates a cross-section of an exemplary ferroelectric memory cell 100, according to some embodiments of the present disclosure. Ferroelectric memory cell 100 is the storage element of a ferroelectric memory device and can include various designs and configurations. Areas circled in dashed lines may include defective edge regions, which contain defective and/or contaminated material caused by the fabrication process to form ferroelectric memory cell 100. As shown in FIG. 1, ferroelectric memory cell 100 is a "1T-1C" cell that includes a capacitor 102, a transistor 104, and an interconnect 106 between capacitor 102 and transistor 104 formed on a substrate 108. Substrate 108 can include silicon (e.g., single crystalline silicon), silicon germanium (SiGe), gallium arsenide (GaAs), germanium (Ge), silicon on insulator (SOI) or any other suitable materials.

In some embodiments, capacitor 102 includes a lower electrode 110, an upper electrode 112, and a ferroelectric layer 114 disposed vertically between lower electrode 110 and upper electrode 112. Detailed structures of ferroelectric layer 114 are shown in FIGS. 2A-2E and 3 and are not included in FIG. 1. Ferroelectric layer 114 may be in contact with and electrically connected to lower electrode 110 on a lower surface, and in contact with and electrically connected to upper electrode 112 on an upper surface. Lower electrode 110 can be electrically connected to transistor 104 through interconnect 106, and upper electrode 112 can be electrically connected to a voltage source (not shown), such that an electrical field can be applied to ferroelectric layer 114. For ease of description, the example of a 1T-1C cell is illustrated in the present disclosure. In various embodiments, ferroelectric layer 114 can be used in any other suitable types of memory cells with more than one capacitor per cell. For example, ferroelectric layer 114 can also be used in a "2T-2C" cell or an "nT-mC" (where n and m are integers) cell. The type of memory cells (e.g., the number of capacitors in a single memory cell) should not be limited by the embodiments of the present disclosure.

The materials of lower electrode 110 and upper electrode 112 can include, but not limited to, at least one of titanium nitride (TiN), titanium silicon nitride (TiSiN$_x$), titanium aluminum nitride (TiAlN$_x$), titanium carbon nitride (TiCN$_x$), tantalum nitride (TaN$_x$), tantalum silicon nitride (TaSiN$_x$), tantalum aluminum nitride (TaAlN$_x$), tungsten nitride (WN$_x$), tungsten silicide (WSi$_x$), tungsten carbon nitride (WCN$_x$), ruthenium (Ru), ruthenium oxide (RuO$_x$), iridium (Ir), doped polysilicon, transparent conductive oxides (TCO), or iridium oxide (IrO$_x$). In some embodiments, the first and/or or the second electrode includes a TCO, which includes, but are not limited to, doped ZnO based TCOs, doped TiO$_2$ based TCOs, doped SnO$_2$ based TCOs, and perovskite TCOs. In some embodiments, the first and/or the second electrode includes La$_{1-x}$Sr$_x$CrO$_3$ (LSCO).

In some embodiments, lower electrode 110 and upper electrode 112 include the same material(s). In some embodiments, lower electrode 110 and upper electrode 112 include different materials. The thickness of lower electrode 110 or upper electrode 112 can be between about 2 nm and about 50 nm, such as between 2 nm and 20 nm (e.g., 2 nm, 3 nm, 4 nm, 5 nm, 8 nm, 10 nm, 15 nm, 18 nm, 20 nm, 25 nm, 30 nm, 35 nm, 40 nm, 45 nm, 50 nm, any range bounded on the lower end by any of these values, or in any range defined by any two of these values). In some embodiments, lower electrode 110 and upper electrode 112 have the same thickness. In some embodiments, lower electrode 110 and upper electrode 112 have different thicknesses.

In some embodiments, ferroelectric layer 114 includes a ferroelectric oxide material doped with a plurality of dopants, which can improve ferroelectric film crystallization. For example, the dopants may provide elasticity during the crystallization of the doped ferroelectric layer, reducing the number of defects formed in the ferroelectric film crystallization, and improving high-K ferroelectric phase formation. It is understood that in some embodiments, ferroelectric layer 114 can include a multi-layer structure.

The ferroelectric oxide material can include a ferroelectric composite oxide. In some embodiments, the ferroelectric oxide material includes oxygen and one or more ferroelectric metals. The ferroelectric metals can include, but not limited to, zirconium (Zr), hafnium (Hf), and titanium (Ti), aluminum (Al), In some embodiments, the ferroelectric oxide material includes oxygen and two or more ferroelectric metals. In some embodiments, the ferroelectric oxide material includes oxygen and a non-metal material such as silicon (Si).

Ferroelectric layer 114 may also include a plurality of dopants formed as a part of the crystal structures. In some embodiments, the dopants compensate the defects formed during the crystallization of the ferroelectric oxide material to improve the film quality of ferroelectric layer 114. In some embodiments, the dopants are different from the ferroelectric metals in the ferroelectric oxide material and include one or more dopants from one or more of Hf, Zr, Ti, Al, Si, hydrogen (H), oxygen (O), vanadium (V), niobium (Nb), tantalum (Ta), yttrium (Y), and/or lanthanum (La).

In some embodiments, transistor 104 includes source/drain regions 120 and a gate stack having a gate dielectric 122 and a gate conductor 124. Source/drain regions 120 can be doped portions in substrate 108 with n-type or p-type dopants at a desired doping level. Gate dielectric 122 can include dielectric materials, such as silicon oxide ($SiO_x$), silicon nitride ($SiN_x$) or high-k dielectric materials including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. Gate conductor 124 can include conductive materials including, but not limited to, tungsten (W), cobalt (Co), copper (Cu), aluminum (Al), polysilicon, silicides, or any combination thereof. Gate conductor 124 can function as the word line of ferroelectric memory cell 100. An interconnect (not shown) can be in contact with one of source/drain regions 120 that is not in contact with interconnect 106 and function as the bit line of ferroelectric memory cell 100.

As described above, edges of ferroelectric layer 114 exposed by upper electrode 112 and lower electrode 110 may be defective as a result of the fabrication process, causing degradation of ferroelectric memory cell 100. FIGS. 2A-2E and FIG. 3 illustrate different exemplary structures of capacitor 102, of which is a part of ferroelectric memory cell 100 with reduced edge defects. In some embodiments, the structures shown in FIGS. 2B and 2C are formed based on the structure illustrated in FIG. 2A.

Figure 2B:
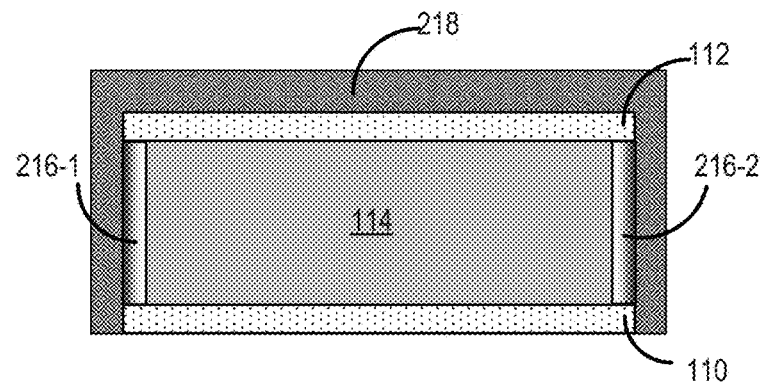
Figure 2C:
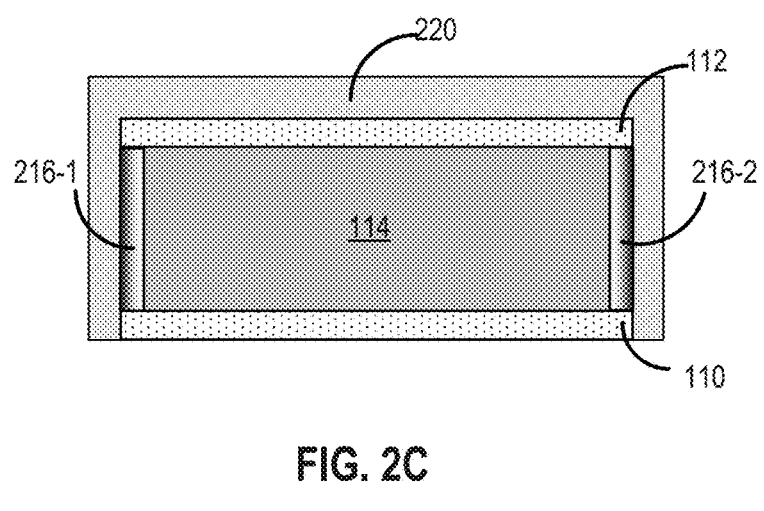

FIG. 2A illustrates capacitor 102 that includes at least one doped portion formed in the defective edge region. As shown in FIG. 2A, ferroelectric layer 114 may include at least one doped portion in the defective edge regions. In some embodiments, the at least one doped portion covers the defective and/or contaminated material in the defective edge regions along the z-direction and between upper and lower electrodes 112 and 110. Upper and lower electrodes 112 and 110 may be parallel along the x-direction and the defective edge regions may be sidewalls of ferroelectric layer 114 exposed along the x-direction. In some embodiments, ferroelectric layer 114 includes a pair of doped portions 216-1 and 216-2 each in the respective defective edge region (e.g., sidewall) on each side of ferroelectric layer 114 along the x-direction. Dopants in doped portions 216-1 and 216-2 may include one or more of Hf, Zr, Ti, Al, Si, H, O, V, Nb, Ta, Y, and La. Dopants may be distributed along a gradient from the top surface of doped portions 216-1 and 216-2 into ferroelectric layer 114. For example, the doping concentration may gradually decrease from the top surfaces doped portions 216-1 and 216-2 to ferroelectric layer 114. In some embodiments, the doping concentration of each of doped portions 216-1 and 216-2 ranges from about $10^{15}$ $cm^{-3}$ to about $10^{21}$ $cm^{-3}$. A doping depth of each of doped portions 216-1 and 216-2 may be sufficient to cover the defective and/or contaminated material along the x-direction. In some embodiments, the doping depth of each of doped portions 216-1 and 216-2 is in a range of about 5 Å to about 10 nm along the x-direction.

The dopants may be formed by an in-situ doping method and may change the crystallization process of ferroelectric layer 114, mitigating the edge effects. In some embodiments, the dopants enhance the crystallization and enlarge the crystal size of ferroelectric layer 114. The dopants may also fill in the defective lattice sites and stabilize the lattice damage, improving the stability of the memory cells.

FIG. 2B illustrates capacitor 102 that includes a healing layer over the at least one doped portion, further reducing the impact of the edge defects in ferroelectric memory cell 100. As shown in FIG. 2B, a healing layer 218 may be over, e.g., covering, each of doped portions 216-1 and 216-2. In some embodiments, healing layer 218 is also over other areas of capacitor 102, such as upper electrode 112. For example, healing layer 218 may cover both doped portions 216-1 and 216-2, and upper electrode 112. Healing layer 218 may include one or more of $HfO_x$, $ZrO_x$, $AlO_x$, hafnium zirconium oxide ($HfZrO_x$), hafnium silicon oxide ($HfSiO_x$), titanium silicon oxide ($TiSiO_x$), and titanium aluminum oxide ($TiAlO_x$). In some embodiments, healing layer 218 is doped with one or more dopants such as Hf, Zr, O, H, Ti, Si, Al, V, Nb, Ta, Y, gadolinium (Gd), and La. In some embodiments, healing layer 218 may have a thickness ranging from about 5 Å to about 500 Å. In some embodiments, the thickness of healing layer 218 is about 50 Å to about 200 Å.

Healing layer 218 may form bonding with ferroelectric layer 114, e.g., the dangling bonds and/or damaged bonds on doped portions 216-1 and 216-2, and/or upper electrode 112, thus passivating these areas if damages/defects are formed during the fabrication process. The passivation may result in a more stabilized ferroelectric memory cell 100 (or ferroelectric layer 114). In some embodiments, the dopants in healing layer 218 occupy at least a portion of the defective lattice sites in doped portions 216-1 and 216-2, and/or upper electrode 112, further repairing the crystalline structure of ferroelectric layer 114. In some embodiments, healing layer 218 is formed in a ferroelectric state and functions as a part of ferroelectric layer 114 for its ferroelectric effect. Healing layer 218 may thus tune or optimize the ferroelectric performance of ferroelectric memory cell 100 in the defective edge regions and mitigate the edge effects.

FIG. 2C illustrates capacitor 102 that includes a block layer over the at least one doped portion, blocking contaminants from ferroelectric memory cell 100. As shown in FIG. 2C, a block layer 220 may be over, e.g., covering, each of doped portions 216-1 and 216-2. In some embodiments, block layer 220 is also over other areas of capacitor 102, such as upper electrode 112. For example, block layer 220 may cover both doped portions 216-1 and 216-2, and upper electrode 112. Block layer 220 may include one or more of silicon nitride, silicon oxynitride, aluminum oxide, and other suitable dielectric materials. In some embodiments, block layer 220 includes aluminum oxide. The material that forms block layer 220 and the thickness of block layer 220 may be configured to block contaminants that can diffuse into ferroelectric layer 114 and/or upper and lower electrodes 112 and 110, such as moisture, oxygen, and/or hydrogen, from ferroelectric layer 114. In some embodiments, the thickness of block layer ranges between about 15 Å to about 500 Å. In some embodiments, block layer 220 may be formed over, e.g., covering, healing layer 218, which covers doped portions 216-1 and 216-2, to further passivate the defective edge region of ferroelectric layer 114 and protect capacitor 102 during the fabrication process.

Figure 2D:
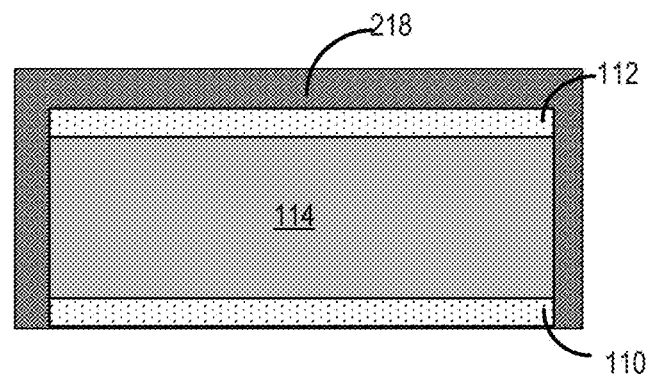

FIG. 2D illustrates capacitor 102 that includes a healing layer over, e.g., covering, defective edge regions of ferroelectric layer 114. As shown in FIG. 2D, a healing layer 218 may be over, e.g., covering, each of defective edge regions of ferroelectric layer 114. In some embodiments, healing layer 218 is also over other areas of capacitor 102, such as upper electrode 112. Healing layer 218 may be similar to or the same as healing layer 218 described in FIG. 2B, and the detailed descriptions of healing layer 218 are not repeated herein. Healing layer 218 may form bonding with ferroelectric layer 114, e.g., the dangling bonds and/or damaged bonds on defective edge regions of ferroelectric layer 114, and/or upper electrode 112, thus passivating these areas if damages/defects are formed during the fabrication process. The passivation may result in a more stabilized ferroelectric memory cell 100 (or ferroelectric layer 114). In some embodiments, the dopants fill in the defective lattice sites in the defective edge regions, and/or upper electrode 112, further improving the stability of ferroelectric layer 114. In some embodiments, healing layer 218 is formed in a ferroelectric state and functions as a part of ferroelectric layer 114 for its ferroelectric effect. Healing layer 218 may thus tune or optimize the ferroelectric performance of ferroelectric memory cell 100 in the defective edge regions and mitigate the edge effects. In some embodiments, healing layer 218 includes one or more dopants, as described for FIG. 2B. The dopants may occupy at least a portion of the defective lattice sites in the defective edge regions and/or upper electrode 112 repairing the crystalline structure of ferroelectric memory cell 100.

Figure 2E:
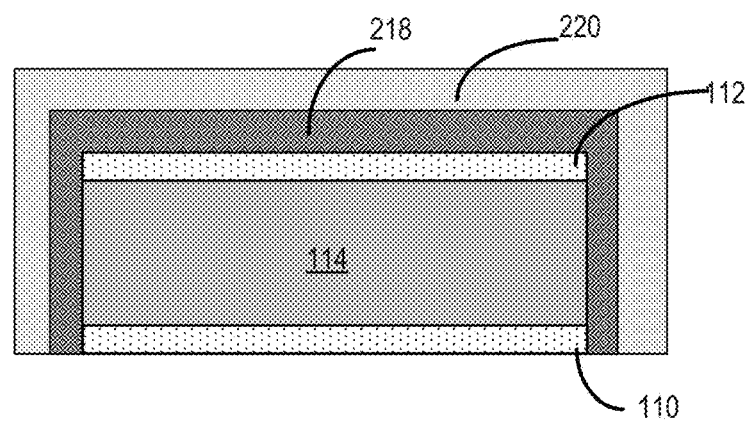

FIG. 2E illustrates a capacitor 102 that includes a healing layer over, e.g., covering, the defective edge regions and a block layer over the healing layer. The healing layer and/or the block layer can also be over, e.g., covering, other parts of capacitor 102. As shown in FIG. 2E, healing layer 218 may be over the defective edge regions and upper electrode 112, as similar to healing layer 218 described in FIG. 2D. Similar to block layer 220 described in FIG. 2C, block layer 220 in FIG. 2E may cover both doped portions 216-1 and 216-2, and upper electrode 112, and may block contaminants that can diffuse into ferroelectric layer 114 and/or upper electrode 112. The detailed description of structures and functions of healing layer 218 and block layer 220 may be referred to the description of FIGS. E and 2D and are not repeated herein.

Figure 3:
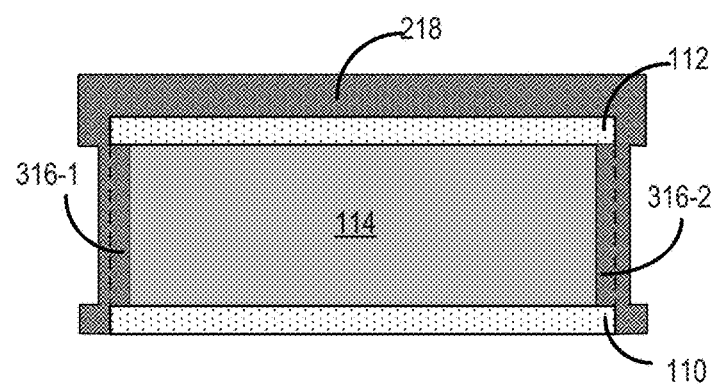

FIG. 3 illustrates a capacitor 102 that includes at least a recessed portion in ferroelectric layer 114 and a healing layer 218 over the recessed portion. The recessed portion may be formed by removing a portion of a defective edge region of ferroelectric layer 114. As shown in FIG. 3, in some embodiments, capacitor 102 includes a pair of recessed portions 316-1 and 316-2 each formed by removing a respective defective edge region on each side of ferroelectric layer 114, e.g., along the x-direction. A healing layer 218 may be formed over, e.g., covering, recessed portions 316-1 and 316-2. In some embodiments, healing layer 218 is also over other areas of capacitor 102, such as upper electrode 112. Recessed portions 316-1 and 316-2 may be formed by the partial or full removal of the respective defective edge region, thus reducing or eliminating the edge defects. Healing layer 218 may be similar to or the same as healing layer 218 described in FIGS. 2B and 2D, and the detailed descriptions of healing layer 218 are not repeated herein.

In some embodiments, healing layer 218 forms bonding with ferroelectric layer 114, e.g., any remaining dangling bonds and/or damaged bonds on defective edge regions of ferroelectric layer 114, and/or upper electrode 112, thus passivating these areas. The passivation may result in a more stabilized ferroelectric memory cell 100 (or ferroelectric layer 114). In some embodiments, the dopants fill in the defective lattice sites in the remaining defective edge regions, and/or upper electrode 112, further repairing the crystalline lattices of ferroelectric layer 114. In some embodiments, healing layer 218 is formed in a ferroelectric state and functions as a part of ferroelectric layer 114 for its ferroelectric effect. Healing layer 218 may thus tune or optimize the ferroelectric performance of ferroelectric memory cell 100 in the defective edge regions and mitigate the edge effects. In some embodiments, healing layer 218 includes one or more dopants, as described for FIG. 2B. The dopants may occupy at least a portion of the remaining defective lattice sites in recessed portions 316-1 and 316-2 and/or upper electrode 112, improving the stability of ferroelectric memory cell 100.

Although not shown in the figures of the present disclosure, in some embodiments, a block layer is formed over the healing layer or covering the recessed portions. For example, a block layer can be formed over healing layer 218 or be in contact with recessed portions 316-1 and 316-2 (e.g., without the formation of the healing layer). In some embodiments, at least one of healing layer 218 and the block layer is formed over recessed portions 316-1 and 316-2, which are in contact with the at least one of healing layer 218 and the block layer. The functions and formation of the block layer can be similar to or the same as block layer 220 in FIGS. 2C and 2E, and the detailed description is thus not repeated herein.

In some embodiments, doped portions are formed in ferroelectric layer 114 after the recessed portions are formed. The doped portions may be exposed between upper electrode 112 and lower electrode 110. The doped portions can further mitigate the edge effects. A healing layer and/or a block layer may cover the doped portions. The formation of the doped portion may be similar to or the same as the formation of doped portions 216-1 and 216-2 illustrated in FIG. 2A, and the formation of the healing layer and the block layer may be similar to or the same as the formation of healing layer 218 and the block layer 220 illustrated in FIGS. 2B-2E. The detailed description is not repeated herein.

Figure 4A:
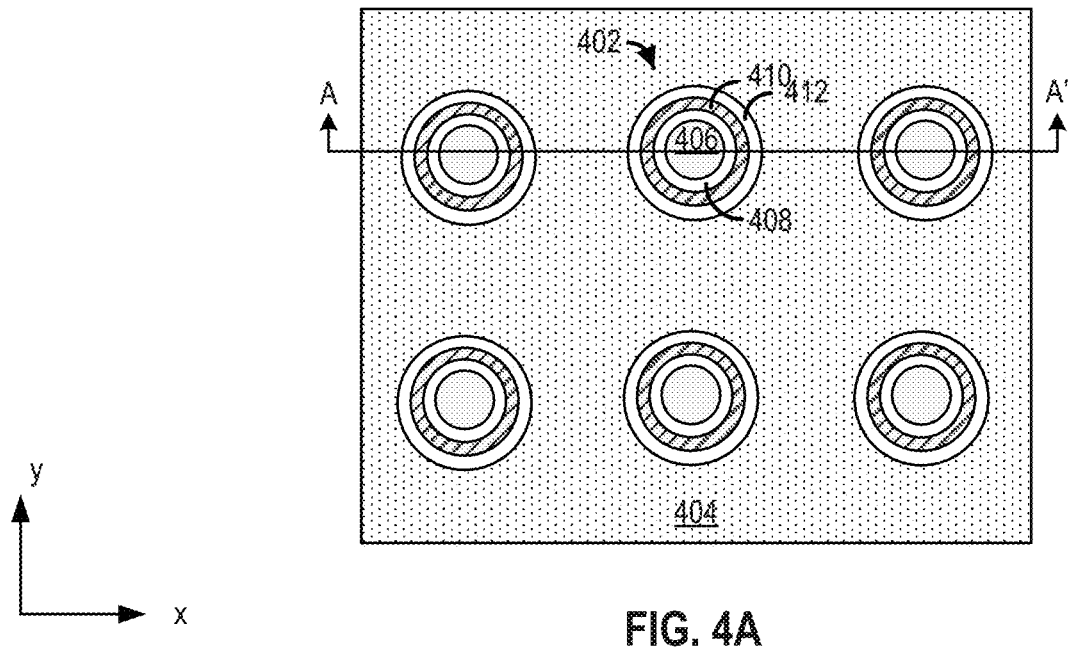
FIG. 4A illustrates a plan view of an exemplary ferroelectric memory device, according to some embodiments of the present disclosure.
Figure 4B:
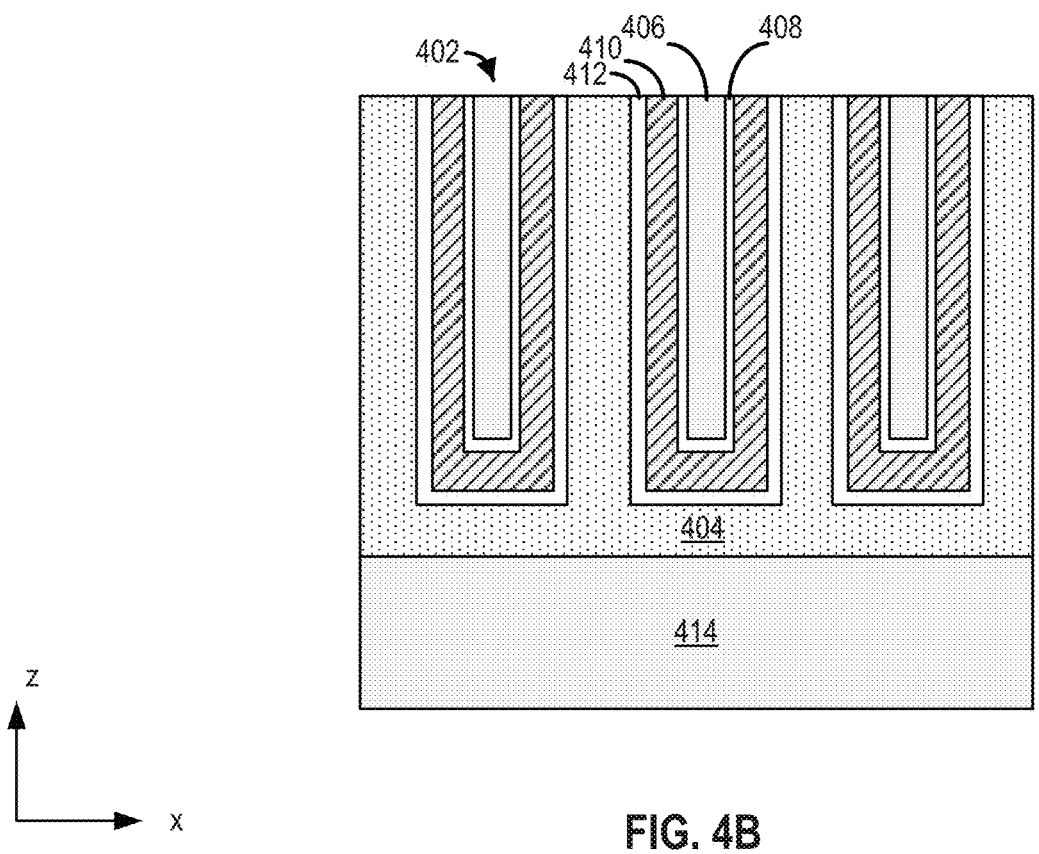
FIG. 4B illustrates a cross-section of an exemplary ferroelectric memory device, according to some embodiments of the present disclosure.

FIG. 4A illustrates a plan view of an exemplary ferroelectric memory device 400, according to some embodiments of the present disclosure. FIG. 4B illustrates a cross-section of ferroelectric memory device 400 along the A-A' direction, according to some embodiments. Ferroelectric memory cell 100 is part of a planar ferroelectric memory device. The similar structure can be implemented into 3D ferroelectric memory devices, such as ferroelectric memory device 400, to improve the ferroelectric properties and memory cell array density.

Ferroelectric memory device 400 can include an array of ferroelectric memory strings 402 disposed in one or more interlayered dielectric (ILD) layers 404 and extending vertically above a substrate (not shown). Each ferroelectric memory string 402 has a circular shape in the plan view and includes a conductor layer 406, a second electrode 408, a ferroelectric layer 410, and a first electrode 412 disposed radially from the center of ferroelectric memory string 402 in this order. That is, ferroelectric layer 410 can be disposed radially between second electrode 408 and first electrode 412. Conductor layer 406 fills the remaining area inside second electrode 408 and includes a conductor material, such as a metal. It is understood that the shape of ferroelectric memory string 402 in the plan view is not limited to circular and can be any other shapes, such as rectangular, square, oval, etc.

FIG. 4B illustrates a cross-section of ferroelectric memory device 400 along A-A direction. As shown in FIG. 4B, ferroelectric memory device 400 includes a substrate 414 and the one or more ILD layers 404 disposed above substrate 414. Ferroelectric memory device 400 can also include a plurality of ferroelectric memory strings 402 extending vertically through ILD layers 404 and above substrate 414. In some embodiments, ferroelectric memory device 400 is electrically connected to one or more transistors via an interconnect (the transistors and the interconnects are not shown in FIG. 4B).

Ferroelectric layer 410, second electrode 408, and first electrode 412 may be similar to ferroelectric layer 114, upper electrode 112, and lower electrode 110 described above in detail in FIGS. 1-3 except being rotated right or left 90 degrees. Ferroelectric layer 410 can be disposed radially between second electrode 408 and first electrode 412. In some embodiments, ferroelectric layer 410, second electrode 408, and first electrode 412 may each have a "U" shape, and defective edge regions of ferroelectric layer 410 may be exposed by second electrode 408 and first electrode 412 on top surfaces of ferroelectric layer 410. FIGS. 5A-5E and FIG. 6 illustrate structures of memory string 402 with reduced edge defects. Specifically, with conductor layer 406 not being considered, structures in FIGS. 5A-5E may respectively be similar to structures in FIGS. 2A-2E, and structures in FIG. 6 may respectively be similar to structure in FIG. 3.

Figure 5C:
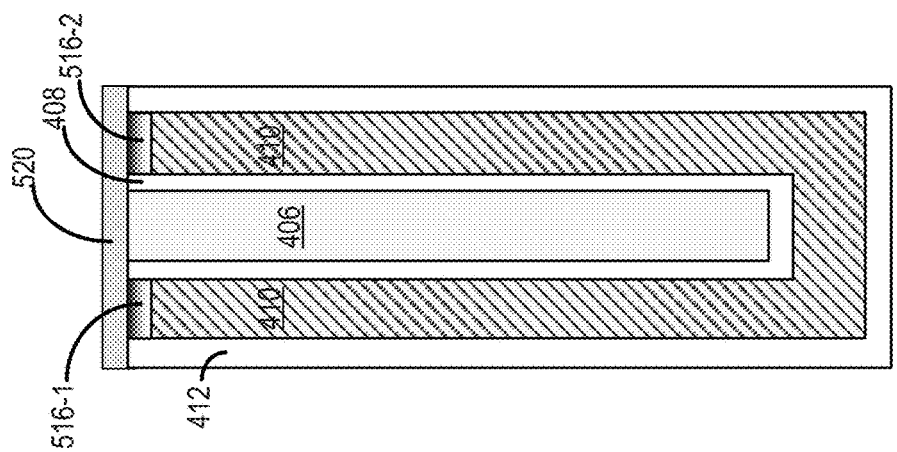
Figure 5B:
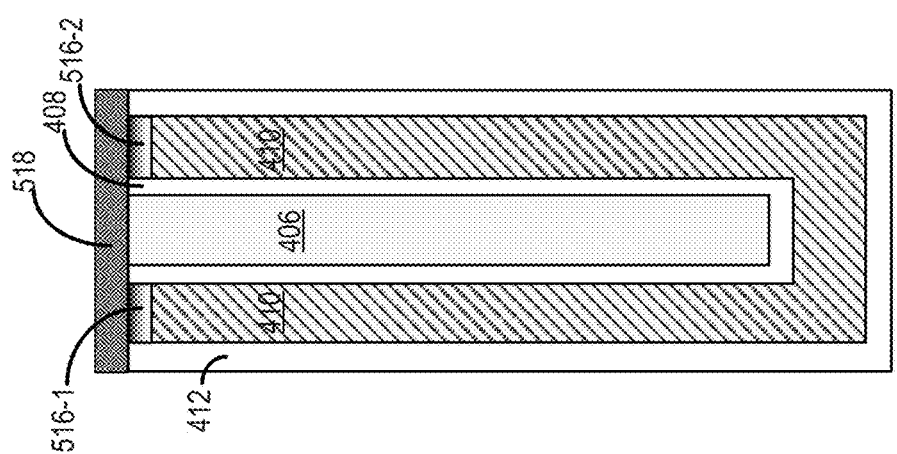
Figure 5A:
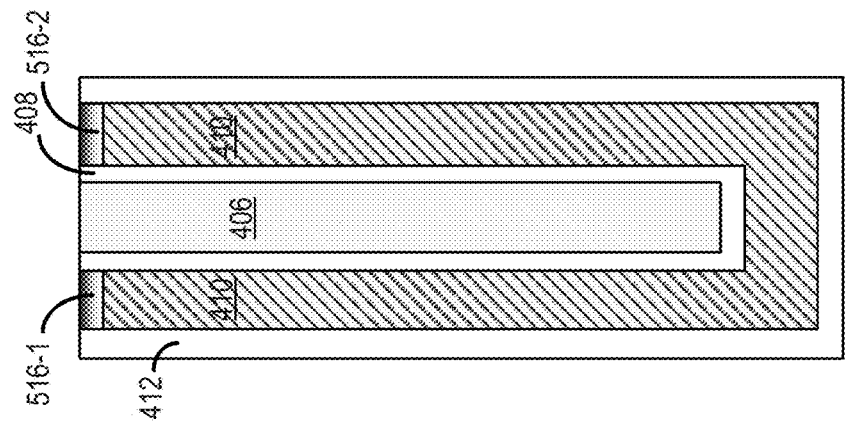
Figure 5E:
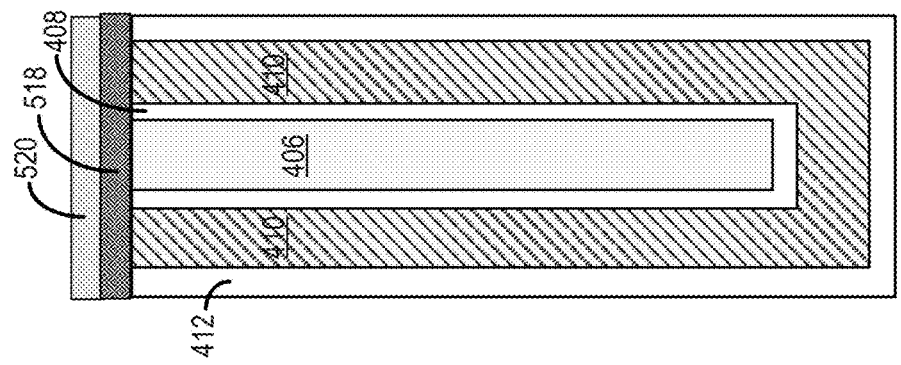
Figure 5D:
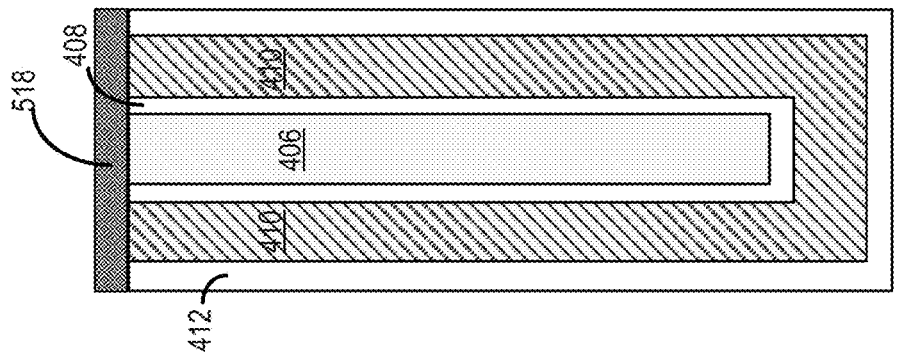

In some embodiments, as shown in FIG. 5A, ferroelectric memory string 402 includes a pair of doped portions 516-1 and 516-2 respectively in the defective edge regions of ferroelectric layer 410, e.g., exposed by the top surfaces of ferroelectric layer 410. In some embodiments, as shown in FIG. 5B, ferroelectric memory string 402 includes a pair of doped portions 516-1 and 516-2 respectively in the defective edge regions of ferroelectric layer 410 and a healing layer 518 over, e.g., covering, doped portions 516-1, 516-2, first electrode 412, and second electrode 408. In some embodiments, as shown in FIG. 5C, ferroelectric memory string 402 includes a pair of doped portions 516-1 and 516-2 respectively in the defective edge regions of ferroelectric layer 410 and a block layer 520 over, e.g., covering, doped portions 516-1, 516-2, first electrode 412, and second electrode 408. In some embodiments, as shown in FIG. 5D, ferroelectric memory string 402 includes a healing layer 518 over, e.g., covering, defective edge regions of ferroelectric layer 410 exposed by the top surfaces of ferroelectric layer 410, first electrode 412, and second electrode 408. In some embodiments, as shown in FIG. 5E, ferroelectric memory string 402 includes a healing layer 518 over, e.g., covering, defective edge regions of ferroelectric layer 410, first electrode 412, and second electrode 408. Memory string 402 may also include a block layer 520 over, e.g., covering healing layer 518. In some embodiments, as shown in FIG. 6, ferroelectric memory string 402 includes a pair of recessed portions 616-1 and 616-2 respectively in the defective edge regions of ferroelectric layer 410, and a healing layer 518 over, e.g., covering, recessed portions 616-1 and 616-2, first electrode 412, and second electrode 408. The structures and functions of each component illustrated in FIGS. 5A-5E and FIG. 6 can be referred to the corresponding structures illustrated in FIGS. 2A-2E and FIG. 3 and thus, are not repeated herein.

Figure 7A:
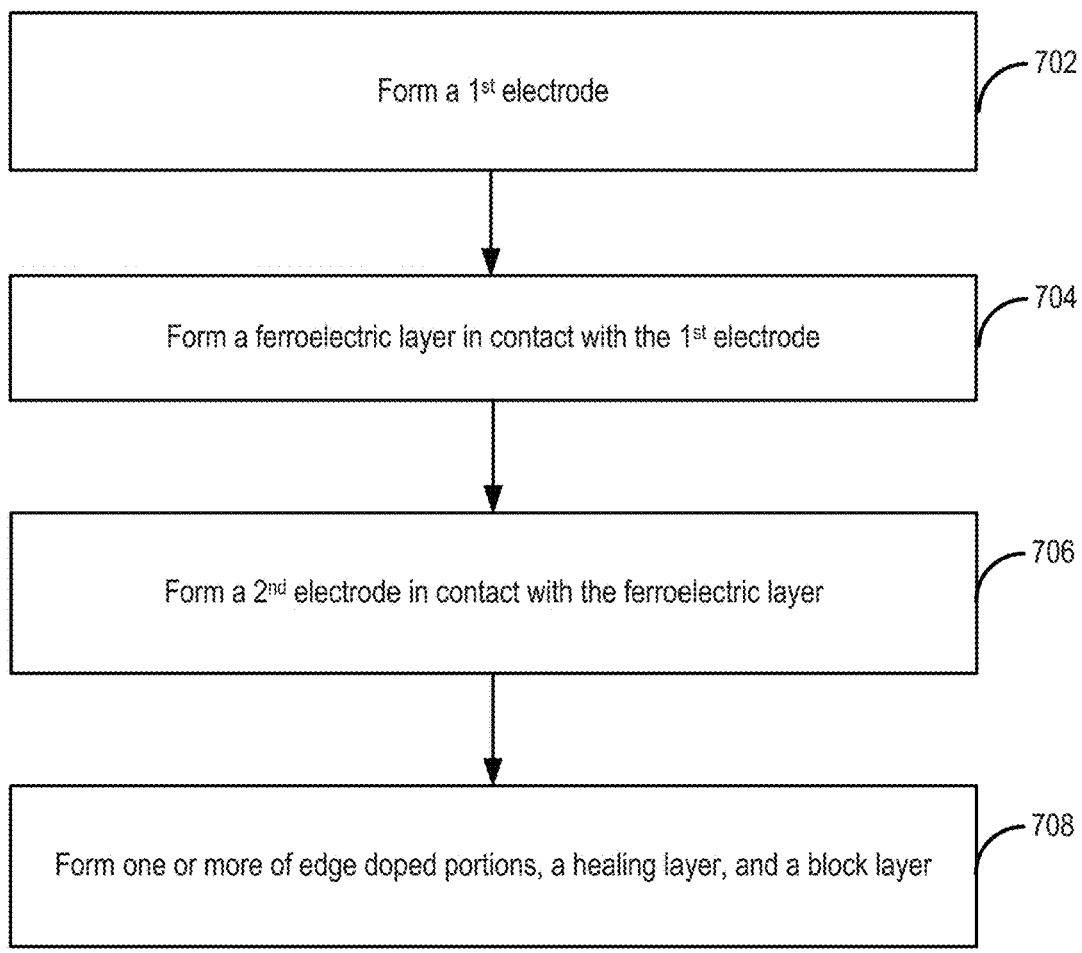
FIG. 7A is a flowchart of an exemplary method for forming a ferroelectric memory cell, according to some embodiments of the present disclosure.
Figure 7B:
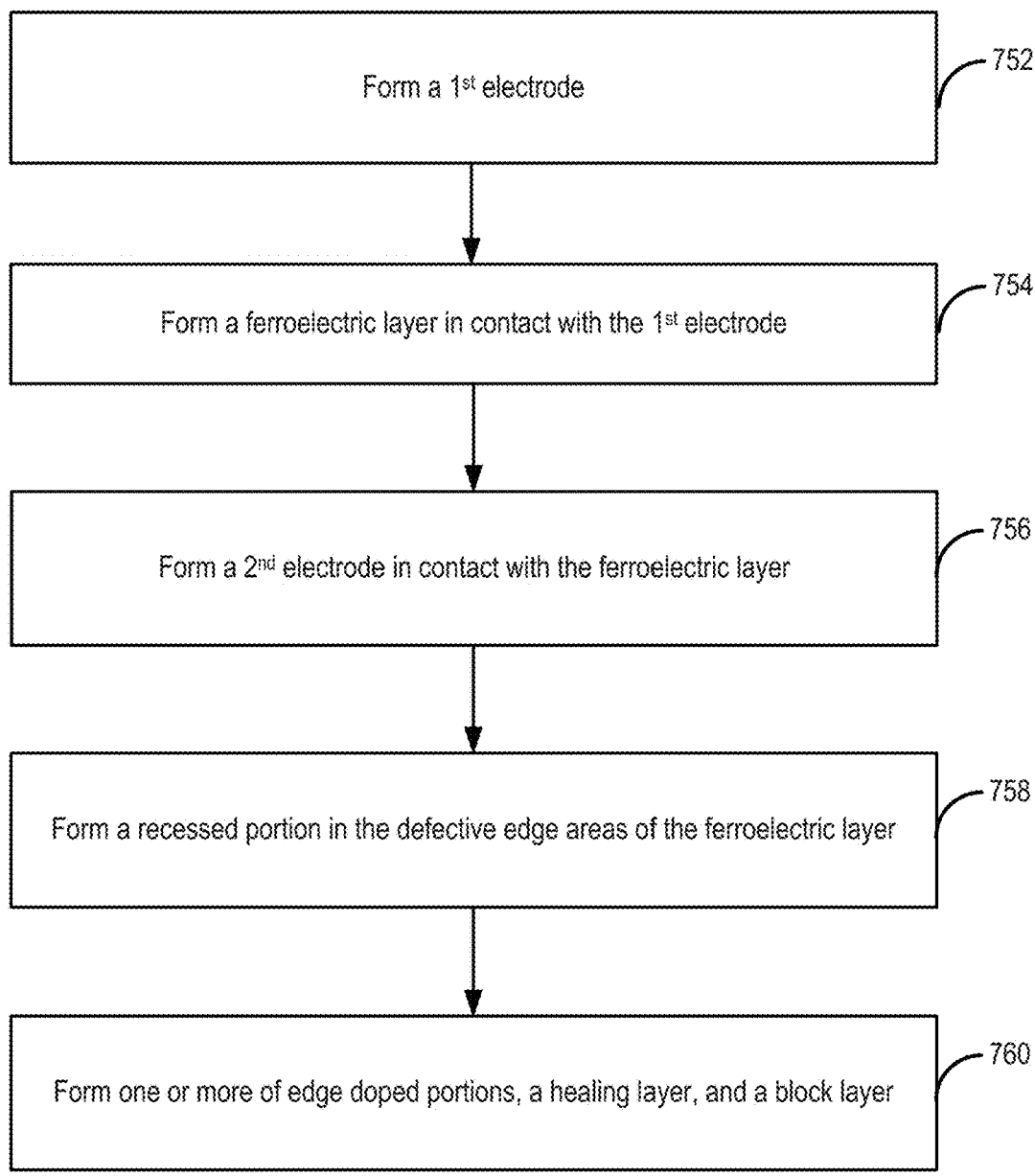
FIG. 7B is a flowchart of an exemplary method for forming another ferroelectric memory cell, according to some embodiments of the present disclosure.

FIGS. 7A and 7B each illustrates an exemplary fabrication method (e.g., 700 and 750) to form a capacitor that is part of a ferroelectric memory cell with reduced edge defects, according to some embodiments. For ease of illustration, FIG. 7A describes the fabrication processes of capacitor 102 illustrated in FIGS. 2A-2E, and FIG. 7B describes the fabrication process of capacitor 102 illustrated in FIG. 3. For ease illustration, FIGS. 7A and 7B are described with FIGS. 2-6. For ease of description, the fabrication of memory string 402 is described together with the fabrication of capacitor 102 in FIGS. 2-3. It should be understood that the operations shown in methods 700 and 750 are not exhaustive and that other operations can be performed as well before, after, or between any of the illustrated operations. Further, some of the operations may be performed simultaneously, or in a different order than shown in FIGS. 7A and 7B.

Referring to FIG. 7A, method 700 starts at operation 702, in which a first electrode is formed. In some embodiments, a lower electrode (e.g., lower electrode 110 or first electrode 412) is formed, for example, in an interlayer dielectric (ILD) layer. The lower electrode can include a conductive layer deposited using at least one of physical vapor deposition (PVD), chemical vapor deposition (CVD), electrochemical deposition, atomic layer deposition (ALD), and pulsed laser deposition (PLD). The thickness of the lower electrode can be between, e.g., 2 nm and 50 nm. Fabrication processes to form the conductive layer can also include photolithography, chemical mechanical polishing (CMP), wet/dry etch, or any combination thereof. The ILD layer can include dielectric materials deposited by one or more thin film deposition processes including, but not limited to, CVD, PLD, ALD, sol-gel process, MOCVD, CSD, or any combination thereof.

Method 700 proceeds to operation 704, as illustrated in FIG. 7A, in which a ferroelectric layer (e.g., ferroelectric layer 114 or 410) is formed in contact with the first electrode. The ferroelectric layer may be formed above and in contact with the lower electrode. The ferroelectric layer can include a dielectric material (e.g., ferroelectric oxide material). The dielectric material can include, but not limited to, oxygen and one or more ferroelectric metals, such as Zr, Hf, Al, and Ti. The dielectric material can be doped with dopants of one or more of Hf, Zr, Ti, Al, Si, H, O, V, Nb, Ta, Y, and La. The dielectric material can be doped with any suitable deposition process such as CVD, ALD, PVD, sol-gel process, MOCVD, CSD process, or any combination thereof. The dopants can be formed in any suitable process such as ion-implantation, in-situ doping, thermal diffusion, or a combination thereof.

Method 700 proceeds to operation 706, as illustrated in FIG. 7A, in which an upper electrode (e.g., upper electrode 112 or second electrode 408) is formed in contact with the ferroelectric layer. The upper electrode is formed above and in contact with the ferroelectric layer (e.g., ferroelectric layer 114 or 410). The upper electrode can include a conductive layer deposited using at least one of PVD, CVD, electrochemical deposition, PLD, chemical vapor deposition, and ALD. The thickness of the upper electrode can be between, e.g., 2 nm and 50 nm.

In some embodiments, to fabricate each ferroelectric memory string 402, a vertical opening (e.g., a hole or a trench) can be etched through one or more ILD layers 404 using wet etch and/or dry etch before the formation of the first electrode. First electrode 412, ferroelectric layer 410, and second electrode 408 can be sequentially deposited into the vertical opening to cover the sidewalls and bottom of the vertical opening using one or more thin film deposition processes, such as PVD, CVD, electrochemical deposition, ALD, and any combination thereof. Conductor layer 406 can be deposited afterwards to fill the remaining space in the vertical opening. In some embodiments, conductor layer 406 partially fills the space in the vertical opening, and a dielectric structure (not shown) can be deposited to fill up the rest of the space in the vertical opening.

Method 700 proceeds to operation 708, as illustrated in FIG. 7A, in which one or more of doped portions, a healing layer, and a block layer are formed. As mentioned previously, exposed edge regions (e.g., exposed sidewalls of ferroelectric layer 114 in ferroelectric memory cell 100 or exposed top surfaces of ferroelectric layer 410 in ferroelectric memory string 402) of a ferroelectric layer may be damaged and/or contaminated, resulting in defective edge regions.

In some embodiments, one or more doped portions, each formed in a respective defective edge region, are formed. Referring back to FIG. 2A, doped portions 216-1 and 216-2 may be formed by one or more of CVD, ALD, and/or plasma doping during or after the formation of the ferroelectric layer (e.g., 114 or 410), using dopant-containing or dopant related precursors. Doped portions 216-1 and 216-2 may include one or more of dopants such as Hf, Zr, O, Ti, Si, Al, H, V, Nb, Ta, Y. In some embodiments, Hf-related precursors may include tetrakis(ethylmethylamino)hafnium (TEMAH), tetrakis(dimethylamido)hafnium (TDMAH), and other suitable precursors. In some embodiments, Zr-related precursors include tetrakis(ethylmethylamide) zirconium (TEMAZ), tris(dimethylamino)cyclopentadienyl zirconium (ZyALD), and other suitable precursors. In some embodiments, Al-related precursors include trimethyaluminum (TMA), and other suitable precursors. In some embodiments, Ti-related precursors include $TiCl_4$, tetrakis (ethylmethyl-amido) titanium (TEMAT), tetrakis(dimethylamino)titanium (TDMAT), and other precursors. In some embodiments, Si-related precursors include $SiH_4$, $Si_2H_6$, dichlorosilane (DCS), and other precursors. In some embodiments, a plurality of monolayers of dopant-rich materials are formed after the doping process.

Optionally, a thermal diffusion process (e.g., a drive-in process) can be performed to improve the doping profiles of dopants. The temperature of the thermal diffusion process may be in a range of about 200 degrees Celsius to about 700 degrees Celsius. In some embodiments, the temperature of the thermal diffusion process is in a range of about 250 degrees Celsius to about 450 degrees Celsius. Optionally, an annealing process, e.g., a rapid thermal anneal, can be performed after the doping process. The environment of the anneal process may be vacuum, or include gases such as $N_2$, $H_2$, and/or $O_2$. The temperature of the anneal process may be in a range of about 300 degrees Celsius to about 800 degrees Celsius. In some embodiments, for a rapid thermal anneal, the temperature is in a range of about 650 degrees Celsius to about 1100 degrees Celsius. The annealing process may increase the possibility that the dopants form bonds with the defective lattice sites, repairing the damaged lattices of the ferroelectric layer and further removing defects.

In some embodiments, a healing layer is formed over the defective edge regions. In some embodiments, the healing layer covers and is in contact with the doped portions. In some embodiments, no doped regions are formed and the healing layer covers the defective edge regions. Referring back to FIG. 2B, healing layer 218 is formed over doped portions 216-1 and 216-2, and upper electrode 112. Referring back to FIG. 2D, healing layer 218 is formed to cover the defective edge regions of ferroelectric layer 114 and upper electrode 112. A suitable deposition process with step coverage may be performed to form healing layer 218. The deposition process may include a CVD, an ALD, a sol-gel process, a metal-organic chemical vapor deposition (MOCVD), and/or a chemical solution deposition (CSD). In some embodiments, healing layer 218 includes ferroelectric oxides such as one or more of $HfO_x$, $ZrO_x$, $AlO_x$, $HfZrO_x$, $HfSiO_x$, and $TiAlO_x$. Suitable metal precursors and non-metal precursors may be employed to form the ferroelectric oxides. The reaction temperature (e.g., of the CVD and/or the ALD) to form healing layer 218 may be in the range of about 200 degrees Celsius to about 700 degrees Celsius. In some embodiments, the reaction temperature is between about 250 degrees Celsius to about 450 degrees Celsius. In some embodiments, another annealing process is performed to improve the repairing of ferroelectric layer 114 (e.g., or 410). The annealing temperature may be about 250 degrees Celsius to about 850 degrees Celsius.

Healing layer 218 may include one or more dopants such as Hf, Zr, O, H, Ti, Si, Al, V, Nb, Ta, Y, Gd, and/or La. The doping process may take place during and/or after the forming of healing layer 218. In some embodiments, the doping process is performed after the deposition of healing layer 218 and includes an ion implantation process and/or a plasma doping process. In some embodiments, the doping process includes an in-situ doping process and dopant-related precursors are employed to form the dopants. The in-situ doping process may include a CVD, an ALD, a MOCVD, a CSD, and/or a sol-gel process. In some embodiments, Hf-related precursors include tetrakis(ethylmethylamino)hafnium (TEMAH), tetrakis(dimethylamido)hafnium (TDMAH), and other suitable precursors. In some embodiments, Zr-related precursors include tetrakis(ethylmethylamide) zirconium (TEMAZ), tris(dimethylamino)cyclopentadienyl zirconium (ZyALD), and other suitable precursors. In some embodiments, Al-related precursors include trimethyaluminum (TMA), and other suitable precursors. In some embodiments, Ti-related precursors include $TiCl_4$, tetrakis (ethylmethyl-amido) titanium (TEMAT), tetrakis(dimethylamino)titanium (TDMAT), and other precursors. In some embodiments, Si-related precursors include $SiH_4$, $Si2H_6$, dichlorosilane (DCS), and other suitable precursors. In some embodiments, V-related precursors include tetrakis(dimethylamino)vanadium, and other suitable precursors. In some embodiments, Nb-related precursors include tris(diethylamido)(tert-butylimido)niobium (TBTDEN), niobium pentachloride (NbCl5), and other suitable precursors. In some embodiments, Y-related precursors include tris(butylcyclopentadienyl)yttrium, and other suitable precursors. In some embodiments, La-related precursors include lanthanum tetramethylheptanedionate and other suitable precursors. In some embodiments, Gd-related precursors include tris(isopropyl-cyclopentadienyl) gadolinium and other suitable precursors. In some embodiments, a thermal treatment having a process temperature of about 250 degrees Celsius to about 800 degrees Celsius is performed to improve the bonding between the dopants and the defective lattice sites. In some embodiments, the process temperature is between about 450 degrees Celsius to about 700 degrees Celsius.

In some embodiments, to form capacitor 102 shown in FIG. 218, doped portions 216-1 and 216-2 are formed before the formation of healing layer 218. In some embodiments, after the doping process of doped portions 216-1 and 216-2, healing layer 218 is deposited, and the annealing process (e.g., for the annealing of dopants in doped portions 216-1 and 216-2) is performed after the doping process and the deposition of healing layer 218. Healing layer 218 may be doped before or after the annealing process. Any suitable post treatment, such as thermal treatment, can be performed after the annealing process. In some embodiments, after the doping process of doped portions 216-1 and 216-2, the annealing process is performed on doped portions 216-1 and 216-2. Healing layer 218 may be deposited after the annealing process. Optionally, another annealing process can be performed to anneal healing layer 218 after the deposition of healing layer 218.

In some embodiments, a block layer is formed over the doped portions. In some embodiments, the block layer covers the edge doped portions. In some embodiments, no doped regions are formed and the block layer covers the defective edge regions. In some embodiments, the block layer is formed to cover the healing layer, which covers the defective edge region (e.g., with or without and edge doped portion). In some embodiments, with block layer 220, healing layer 218 is not annealed. Referring back to FIG. 2C, block layer 220 is formed over doped portions 216-1 and 216-2, and upper electrode 112. Referring back to FIG. 2E, block layer 220 is formed over healing layer 218, which covers the defective edge regions and upper electrode 112. Block layer 220 may include one or more of silicon nitride, silicon oxynitride, other suitable dielectric materials that can sufficiently block contaminants, such as moisture, hydrogen, and/or oxygen, from contacting the structures covered by block layer 220. A suitable deposition process with step coverage may be performed to form block layer 220. The deposition process may include a CVD, an ALD, a sol-gel process, and/or a chemical solution deposition (CSD). The process temperature of the deposition may be in a range of about 350 degrees Celsius to about 750 degrees Celsius.

FIG. 7B illustrates a method to form structures shown in FIG. 3. Referring to FIG. 7B, operations 752-756 may be the same as or similar to operations 702-706. The detailed descriptions of operations 752-756 are not repeated herein. Method 750 proceeds to operation 758, as illustrated in FIG. 7B, in which a recessed portion is formed in the defective edge regions of the ferroelectric layer. Referring back to FIG. 3, recessed portions 316-1 and 316-2 are formed to remove at least portions of defective edge regions of the ferroelectric layer 114. A suitable selective etching process, e.g., wet and/or dry etch, can be performed to remove the defective edge regions of ferroelectric layer 114 over upper and lower electrodes 112 and 110 (or first and second electrodes 412 and 408). In some embodiments, the etching process includes a wet etch. The etching solution may include diluted hydrofluoric (HF) acid and/or diluted hydrochloride (HCl) acid. In some embodiments, diluted HF acid has a ratio of etchant to water about 1:50 to about 1:150. In some embodiments, a vapor phase etching process is performed to form recessed portions 316-1 and 316-2. The etchant of the vapor phase etching process may include one or more of chlorine ($Cl_2$), boron trichloride ($BCl_3$) based chemicals, tetrafluoromethane ($CF_4$) based chemicals, and/or fluorine-based chemicals.

Method 750 proceeds to operation 760, as illustrated in FIG. 7B, in which one or more of a healing layer, a block layer, and edge doped portions are formed. Referring back to FIG. 3, healing layer 218 is formed over recessed portions 316-1 and 316-2 of ferroelectric layer 114. In some embodiments, block layer 220 may be formed to cover recessed portions 316-1 and 316-2 without the formation of healing layer 218. In some embodiments, block layer 220 may be formed to cover healing layer 218, which covers recessed portions 316-1 and 316-2. In some embodiments, with block layer 220, healing layer 218 is not annealed. The formation of block layer 220 may be similar to or the same as the formation of block layer 220 illustrated in FIG. 2C, and the formation of healing layer 218 may be similar or the same process as the formation of healing layer 218 in FIG. 2B. The detailed description is thus not repeated herein.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A ferroelectric memory cell, comprising:
a first electrode;
a second electrode;
a ferroelectric layer disposed between the first electrode and the second electrode and comprising a pair of edge doped portions and a undoped portion between the pair of edge doped portion in a cross-sectional view, wherein
the ferroelectric layer comprises a pair of recessed portions; and
a healing layer, wherein the pair of edge doped portions of the ferroelectric layer and side walls of at least one of the first and second electrodes extending in a first direction are covered by the healing layer, wherein the first direction is perpendicular to an exposed surface of one of the pair of edge doped portions in contact with the healing layer, and a length of the ferroelectric layer extending in the first direction is less than that of each of the first and second electrodes, wherein the healing layer comprises a first material and a plurality of dopants of a second material, the second material being different from the first material.

2. The ferroelectric memory cell of claim 1, wherein: the healing layer comprises at least one of $HfO_x$, $ZrO_x$, $AlO_x$, $HfZrO_x$, $HfSiO_x$, or $TiAlO_x$, and has a thickness of about 5 Å to about 500 Å.

3. The ferroelectric memory cell of claim 1, wherein the healing layer is a single layer and covers the pair of edge doped portions of the ferroelectric layer and all side walls of the first and second electrodes extending the first direction.

4. The ferroelectric memory cell of claim 1, wherein the healing layer is doped with at least one of Hf, Zr, Ti, Al, Si, V, O, H, Nb, Ta, Y, gadolinium (Gd), or La.

5. The ferroelectric memory cell of claim 1, wherein:
the first electrode and the second electrode each comprises at least one of titanium nitride (TiN), titanium silicon nitride (TiSiN$_x$), titanium aluminum nitride (TiAlN$_x$), titanium carbon nitride (TiCN$_x$), tantalum nitride (TaN$_x$), tantalum silicon nitride (TaSiN$_x$), tantalum aluminum nitride (TaAlN$_x$), tungsten nitride (WN$_x$), tungsten silicide (WSi$_x$), tungsten carbide (WCN$_x$), ruthenium (Ru), or ruthenium oxide (RuO$_x$); and
the ferroelectric layer comprises at least one of aluminum (Al), hafnium (Hf), zirconium (Zr), oxygen (O), or titanium (Ti), and is doped with at least one of Hf, Zr, Ti, Al, silicon (Si), hydrogen (H), O, vanadium (V), niobium (Nb), tantalum (Ta), yttrium (Y), or lanthanum (La).

6. The ferroelectric memory cell of claim 1, wherein the healing layer covers an entire lateral surface of at least one of the first and second electrodes, the lateral surface facing away from the ferroelectric layer.

7. The ferroelectric memory cell of claim 1, wherein:
a doping concentration of the one of the pair of edge doped portions extends from the exposed surface of the one of the pair of edge doped portions in contact with the healing layer to the undoped portion of the ferroelectric layer.

8. A ferroelectric memory cell, comprising:
a first electrode;
a second electrode;
a ferroelectric layer disposed between the first electrode and the second electrode, and comprising a pair of edge doped portions and an undoped portion between the pair of edge doped portions in a cross-sectional view; the ferroelectric layer comprises a pair of recessed portions;
a healing layer, wherein the pair of edge doped potions of the ferroelectric layer and side walls of at least one of the first and second electrodes extending in a first directions are covered by the healing layer, wherein the first direction is perpendicular to an exposed surface of one of the pair of edge doped portions in contact with the healing layer, and a length of the ferroelectric layer extending in the first direction is less than that of each of the first and second electrodes, wherein the healing layer comprises a first material and a plurality of dopants of a second material, the second material being different from the first material and
a block layer covering the healing layer.

9. The ferroelectric memory cell of claim 8, wherein:
the one of the pair of edge doped portions comprises at least one of hafnium (Hf), zirconium (Zr), titanium (Ti), aluminum (Al), silicon (Si), hydrogen (H), oxygen (O), vanadium (V), niobium (Nb), tantalum (Ta), yttrium (Y), or lanthanum (La).

10. The ferroelectric memory cell of claim 8, wherein:
the one of the pair of edge doped portions extends laterally from the exposed surface into a depth in the ferroelectric layer, the depth being along the first direction; and
the depth has a range of about 5 Å to about 10 nm.

11. The ferroelectric memory cell of claim 8, wherein the one of the pair of edge doped portions comprises the pair of recessed portions.

12. The ferroelectric memory cell of claim 8, wherein the block layer comprises at least one of silicon nitride, silicon oxynitride, or aluminum oxide, and has a thickness of about 15 Å to about 500 Å.

* * * * *